United States Patent
Tsai et al.

(10) Patent No.: US 9,093,514 B2
(45) Date of Patent: Jul. 28, 2015

(54) STRAINED AND UNIFORM DOPING TECHNIQUE FOR FINFETS

(71) Applicant: Taiwan Semiconductor Manufacturing Co., Ltd., Hsin-Chu (TW)

(72) Inventors: Chun Hsiang Tsai, Xinpu Township (TW); Su-Hao Liu, Jhongpu Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/786,567

(22) Filed: Mar. 6, 2013

(65) Prior Publication Data

US 2014/0252412 A1    Sep. 11, 2014

(51) Int. Cl.
| | |
|---|---|
| *H01L 21/336* | (2006.01) |
| *H01L 29/78* | (2006.01) |
| *H01L 29/66* | (2006.01) |
| *H01L 21/02* | (2006.01) |

(52) U.S. Cl.
CPC ............ *H01L 29/78* (2013.01); *H01L 21/0262* (2013.01); *H01L 21/02521* (2013.01); *H01L 21/02532* (2013.01); *H01L 21/02576* (2013.01); *H01L 21/02639* (2013.01); *H01L 29/66477* (2013.01)

(58) Field of Classification Search
CPC ............ H01L 21/823878; H01L 21/823481; H01L 29/66628; H01L 29/66636; H01L 29/6659; H01L 29/7848
USPC .................. 438/300–305; 257/192, E21.102, 257/E21.43, E21.431
See application file for complete search history.

(56) References Cited

U.S. PATENT DOCUMENTS

| | | | |
|---|---|---|---|
| 2007/0105331 A1* | 5/2007 | Murthy et al. ................. | 438/341 |
| 2008/0242037 A1* | 10/2008 | Sell et al. ...................... | 438/299 |
| 2010/0289086 A1* | 11/2010 | Yu et al. ........................ | 257/369 |
| 2011/0316093 A1* | 12/2011 | Yang et al. .................... | 257/408 |
| 2012/0280251 A1* | 11/2012 | Dube et al. ...................... | 257/77 |

* cited by examiner

*Primary Examiner* — Brook Kebede
(74) *Attorney, Agent, or Firm* — Eschweiler & Associates, LLC (57) ABSTRACT

The present disclosure relates to a device and method of forming enhanced channel carrier mobility within a transistor. Silicon carbon phosphorus (SiCP) source and drain regions are formed within the transistor with cyclic deposition etch (CDE) epitaxy, wherein both resistivity and strain are controlled by substitutional phosphorus. A carbon concentration of less than approximately 1% aids in control of the phosphorus dopant diffusion. Phosphorus dopant diffusion is also controlled by an anneal step which promotes uniform doping through both source and drain, as well as lightly-doped drain regions.

22 Claims, 6 Drawing Sheets

STRAINED AND UNIFORM DOPING TECHNIQUE FOR FINFETS

BACKGROUND

Enhanced charge carrier mobility within a channel region of a complementary metal-oxide-semiconductor (CMOS) device is achieved through strain. Silicon-germanium (SiGe) is a typical material utilized to induce compressive strain in p-type field-effect transistors (PFETs) in a Si channel for increased hole mobility due to the larger lattice constant of Ge compared to Si. Tensile strain may be achieved for increased electron mobility in in-type FETs (NFETs) by the introduction of silicon-carbide (SiC) due to the smaller lattice constant of carbon compared to Si.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Strained-induced mobility enhancement within an NFET is achieved through in-situ doped epitaxy to fabricate raised source/drain (RSD) junctions comprising silicon carbon phosphorus (SiCP). Increasing a substitutional carbon concentration comprising a concentration of carbon which occupies an Si lattice site within an insulation layer comprising buried oxide (BOX) of the NFET results in compressive strain within a channel region between source and drain regions for a substitutional carbon concentration greater than approximately 1%, as measured by X-ray diffraction (XRD). In addition to the mobility enhancement provided by the substitutional carbon, activated or substitutional phosphorous decreases resistivity of the channel. XRD is unable to effectively quantify a substitutional concentration of phosphorous within the NFET. Therefore, secondary ion mass spectrometry (SIMS) is utilized to determine the total concentration of phosphorous by sputtering away the surface of the SiCP RSD and analyzing ejected secondary ions. SIMS essentially destroys the surface of the SiCP RSD. As a result, it cannot be determined whether the measured phosphorous concentration is substitutional or not. Because phosphorous dopant diffusion is controlled by substitutional carbon (i.e., a lattice site occupied by carbon cannot be occupied by phosphorous, and vice-versa), a tradeoff results between strain enhancement by substitutional carbon and reduced resistivity by substitutional phosphorous. Some prior art methods achieve a trade-off resulting in a total carbon concentration of 1.6% for a resistivity of 0.7 Ω·m, which results in a phosphorous concentration of approximately 1E+20 atoms/$cm^3$ to approximately 6E+20 atoms/$cm^3$, as measured via SIMS.

Accordingly, the present disclosure relates to a device and method of forming enhanced channel carrier mobility within a transistor. Silicon carbon phosphorus (SiCP) source and drain regions are formed within the transistor with cyclic deposition etch (CDE) epitaxy, wherein both resistivity and strain are controlled by substitutional phosphorus. A carbon concentration of less than approximately 1% aids in control of the phosphorus dopant diffusion. Phosphorus dopant diffusion is also controlled by an anneal step which promotes uniform doping through both source and drain, as well as lightly-doped drain regions.

Figure 1:
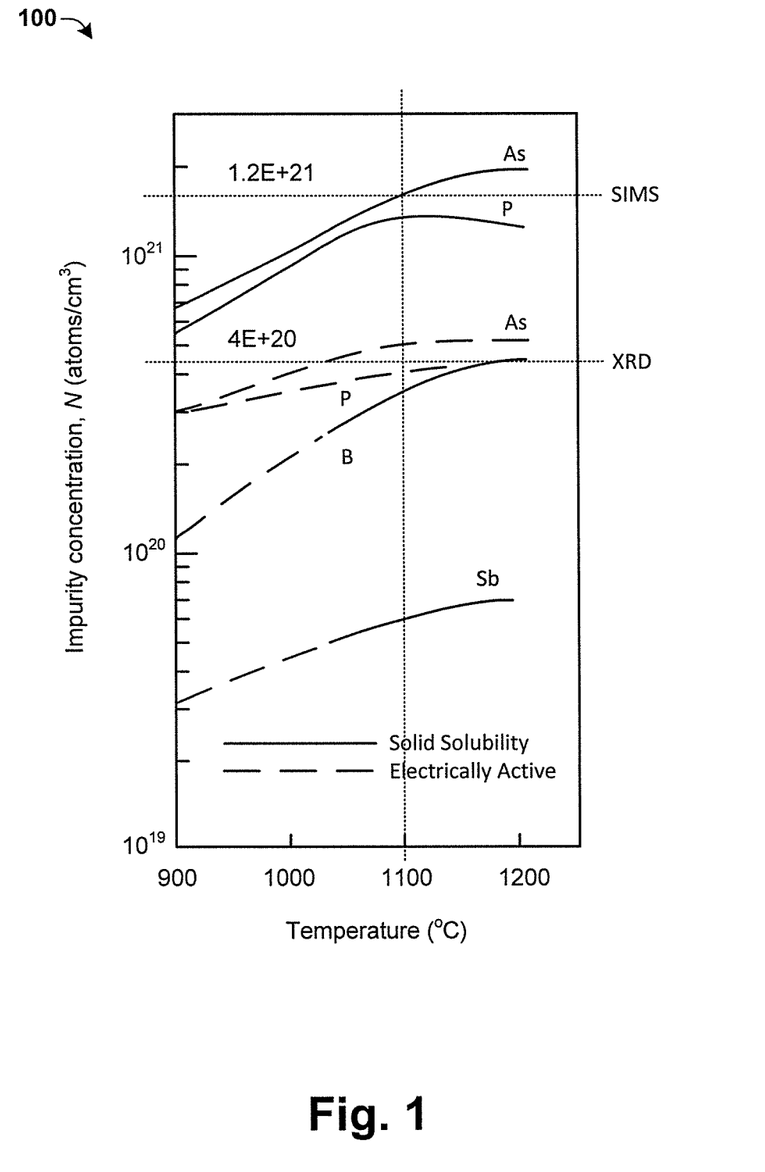
FIG. 1 illustrates a graph of the solid solubilities of arsenic, boron, and phosphorous as a function of temperature.

FIG. 1 illustrates a graph 100 of the solid solubilities of arsenic, boron, and phosphorous as a function of temperature. For phosphorous, an implant and anneal achieves a maximum solid solubility of approximately 1.2E+21 atoms/$cm^3$ at approximately 1100 C. For electrically active (i.e., activated) phosphorous, the concentration drops to approximately 4.0E+20 atoms/$cm^3$ at approximately 1100 C. For substitutional phosphorous, significant strain can be achieved by increasing the phosphorous concentration to approximately 1.0E+21 atoms/$cm^3$ or higher, which may be achieved through cyclic deposition etch (CDE).

CDE comprises a sequence of consecutive deposition and etch steps. For a silicon-containing source vapor deposited through an epitaxial growth method such as chemical vapor deposition (CVD), lattice defects or impurities within a source vapor or growth chamber may result in a degradation of crystal quality within the epitaxial layer as a thickness of the epitaxial layer is increased. As such, after a first pulse of epitaxial growth is achieved, removal of amorphous or polycrystalline portions of the epitaxial layer is achieved through a selective etch within the CDE process, followed by a second pulse of epitaxial growth, and so on, until the epitaxial layer achieves a desired thickness. In some embodiments, halide gases, such as $Cl_2$ or HCl are employed as selective etchants for an Si substrate to perform the selective etch of the amorphous or polycrystalline portions of the epitaxial layer. An HCl etch rate of amorphous or polycrystalline Si is several times higher than that of monocrystalline Si under etch conditions comprising a temperature of approximately 510° C., a pressure between approximately 10 Torr and approximately 90 Torr, and for a duration of between approximately 10 seconds to 20 approximately seconds. For deposition, a silicon-containing source vapor is utilized, comprising silane ($SiH_4$) or trisilane ($Si3H_8$) introduced into a processing chamber continuously during deposition, and forming a silicon-containing epitaxial layer within the recess. In some embodiments, deposition of the source vapor comprises a temperature of approximately 510° C., a pressure between approximately 10 Torr and approximately 90 Torr, and for a duration of between approximately 10 seconds to approximately 20 seconds, achieving a growth rate between approximately 18 Å/cycle and approximately 22 Å/cycle.

To simultaneously achieve tensile strain for increased electron mobility and reduced resistivity within a channel of an NFET, a phosphine ($PH_3$) source is deposited into the recess. A concentration of carbon of less than approximately 0.6% is maintained, which provides no appreciable enhancement to channel mobility, but controls phosphorous diffusion. Substitutional carbon suppresses phosphorus diffusion by displacing Si atoms to interstitial locations within the crystalline Si lattice, thus blocking lanes of diffusion of phosphorus within lattice sites. To achieve this, a carbon source such as monomethyl silane (MMS) is utilized to inject carbon. In some embodiments, the etch chemistry may also contain a germanium source, such as monogermane ($GeH_4$) to increase a selective etch rate of the amorphous or poly-crystalline Si.

For the embodiments of a deposition condition comprising a trisilane ($Si3H_8$) flow rate of approximately 190 standard cubic centimeters per minute (sccm), a phosphine ($PH_3$) flow rate of between approximately 260 sccm and approximately 310 sccm, and a monomethyl silane (MMS) flow rate of between approximately 132 sccm and approximately 120 sccm, in conjunction with a monogermane ($GeH_4$) flow rate of approximately 150 sccm, under aforementioned etch and deposition conditions, a phosphorous concentration of greater than approximately $1E+21$ atoms/$cm^3$ is achieved, as measured by SIMS. In some embodiments, XRD measurements of the resultant lattice structure demonstrate that a strain of SIMS-measured phosphorous concentration of approximately $3E+21$ atoms/$cm^3$ is equivalent to carbon concentration of approximately 1.7%.

Figure 2A:
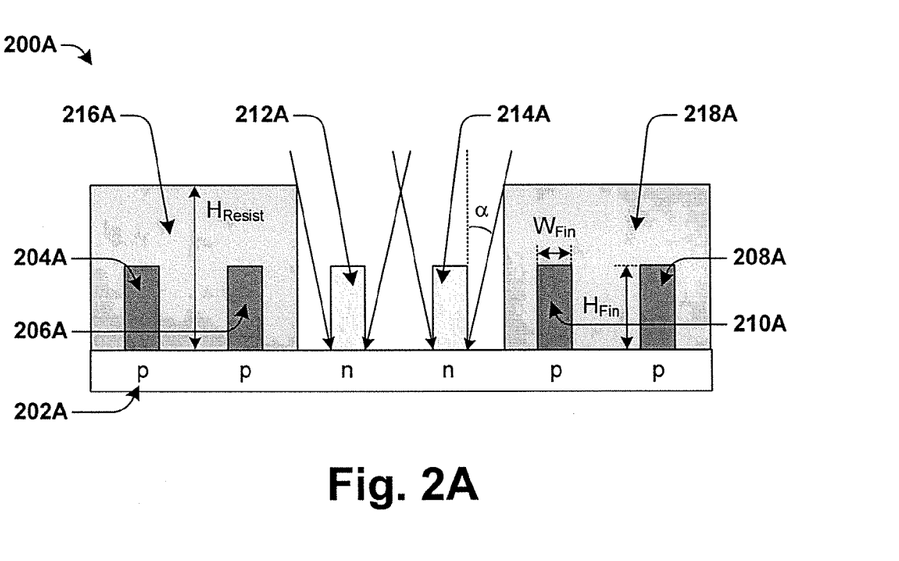
FIGS. 2A-2B illustrate some embodiments of intrinsic implant angle limitations for a FINFET.
Figure 2B:
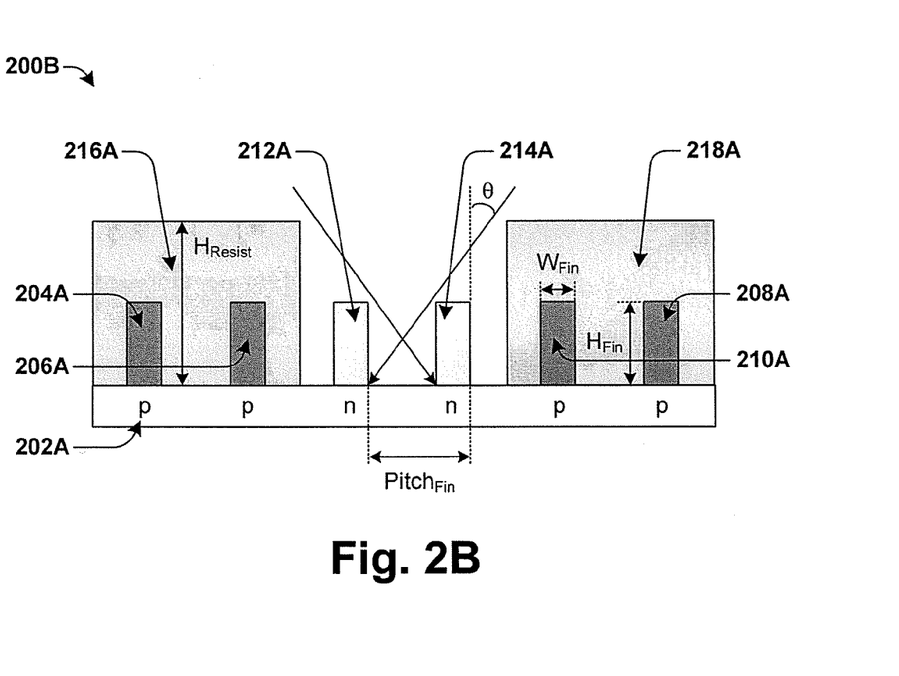

FIGS. 2A-2B illustrate some embodiments of intrinsic implant angle limitations for a FINFET. In some embodiments, implants such as arsenic or phosphorous are utilized in lightly-doped drain (LDD) formation prior to recess formation. FIG. 2A illustrates some embodiments of a cross-sectional view 200A of a FINFET structure comprising an Si substrate 202A, a first p-type fin 204A and a second p-type fin 206A disposed within a first photoresist block 216A, a first n-type fin 212A and a second n-type fin 214A, and a third p-type fin 208A and a fourth p-type fin 210A disposed within a second photoresist block 218A. An LDD implant formed within a respective n-type fin is fundamentally limited by a height of a photoresist block ($H_{resist}$), causing an implant shadowing effect wherein a first implant angle $\alpha$ is constrained by $H_{resist}$. Similarly, as illustrated by FIG. 2B, a second implant angle $\theta$ is constrained by the fin pitch ($Pitch_{Fin}$). In some embodiments, the first implant angle $\alpha$ or the second implant angle $\theta$ comprise a value of approximately 10° or less. In some embodiments, a non-uniform LDD top to bottom dopant distribution results from the implant shadowing effect, wherein a bottom of a respective fin LDD region receives approximately 30% or less dopant concentration than top fin LDD in some embodiments.

Figure 3A:
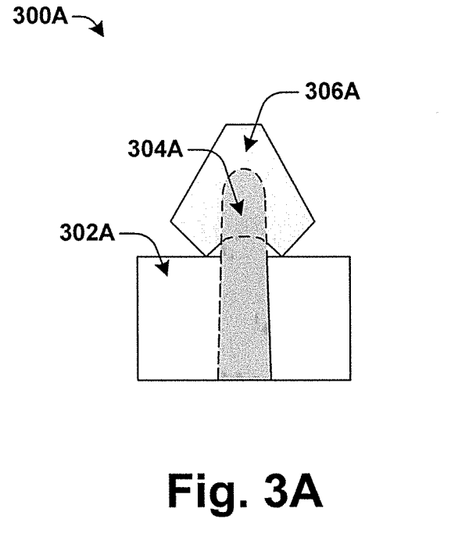
FIGS. 3A-3C illustrate some embodiments of source and drain epitaxial layer and lightly-doped drain formation for a FINFET.
Figure 3B:
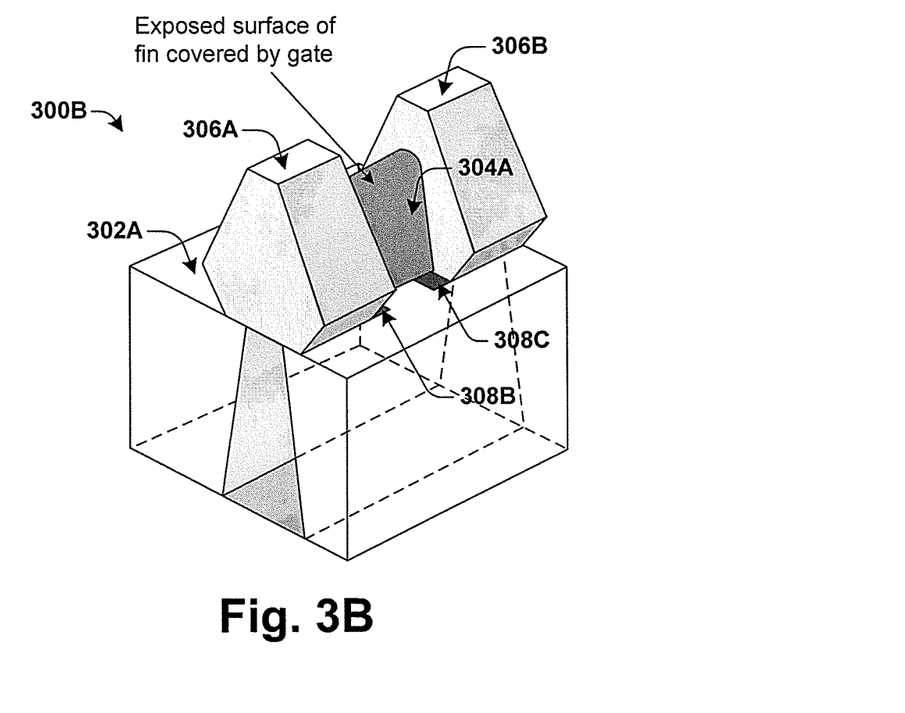
Figure 3C:
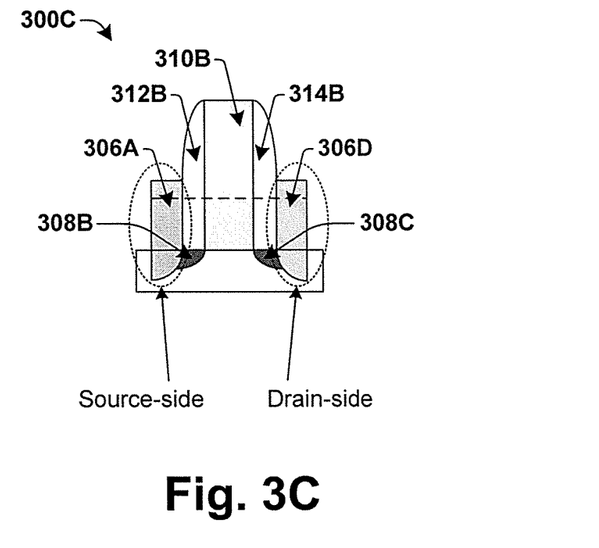

FIG. 3A illustrates some embodiments of a cross-section of a FINFET 300A formed on a substrate 302A, comprising a source epitaxial layer 306A disposed over an n-type fin 304A and residing on a source side. FIG. 3B illustrates a three-dimensional cutout 300B of the FINFET 300A, wherein a drain epitaxial layer 306B resides on a drain side of the n-type fin 304A. A location of LDD implants 308B and 308C are shown. In a full FINFET gate build 300C as illustrated in FIG. 3C, wherein a gate 310B, a source-side main spacer 312B, and a drain-side main spacer 314B have been disposed above an exposed surface of the first n-type fin 304A, the location of the LDD implants 308B and 308C are also shown.

While a source or drain region of a FINFET formed from a respective fin receives a dopant implant in-situ during the CDE process, the LDD, desired to mitigate against hot-carrier effects, and is formed beneath a main gate spacer at the bottom of the respective fin. In some embodiments, LDD formation comprises an ion implantation step of a phosphorous-containing material or an arsenic-containing material performed after deposition of an offset spacer comprising a width between approximately 1 nm and approximately 3 nm, and before deposition of the main space comprising a width between approximately 3 nm and approximately 10 nm. As a result of the fundamentally limitations of $\alpha$ and $\theta$, a significant portion of the LDD implant is limited to the top portion of a respective fin. To offset this effect, a post-implant anneal is performed to promote diffusion of the LDD implant from the source or drain region to the LDD implant region.

In some embodiments, the LDD implant is deposited after the offset spacer deposition for the purpose of electrical isolation of the gate during subsequent fabrication steps such as recess formation, epitaxial material deposition within the recess the CVD CDE, and main gate spacer formation. In some embodiments, formation of the LDD comprises an ion implantation of a phosphorous-containing material (e.g., $PH_3$) or an arsenic containing material (e.g., As) comprising an energy between approximately 1 keV to approximately 3 keV and a dose of between approximately $1E+15$ atoms/$cm^3$ and approximately $5E+15$ atoms/$cm^3$. For the embodiments wherein the implant shadowing effect results in a bottom of a respective fin LDD comprising a dopant concentration with a value approximately 30% that of a dopant concentration at the top of the respective fin, a conformality ratio between a bottom region and a side wall region of the respective fin is less than approximately 0.3.

In some embodiments, a more uniform dopant distribution is achieved by performing a post-implantation anneal comprising a millisecond anneal further comprising a temperature between approximately 1100° C. and 1200° C. for a duration between approximately 0.9 ms and approximately 3 ms, or a laser anneal comprising a temperature between approximately 1100° C. and 1250° C. These conditions have been shown to promote phosphorous diffusion throughout the respective fin and achieve a conformality ratio of phosphorous dopant within a bottom region and a side wall region of a fin is between approximately 0.5 and approximately 1.

Figure 4A:
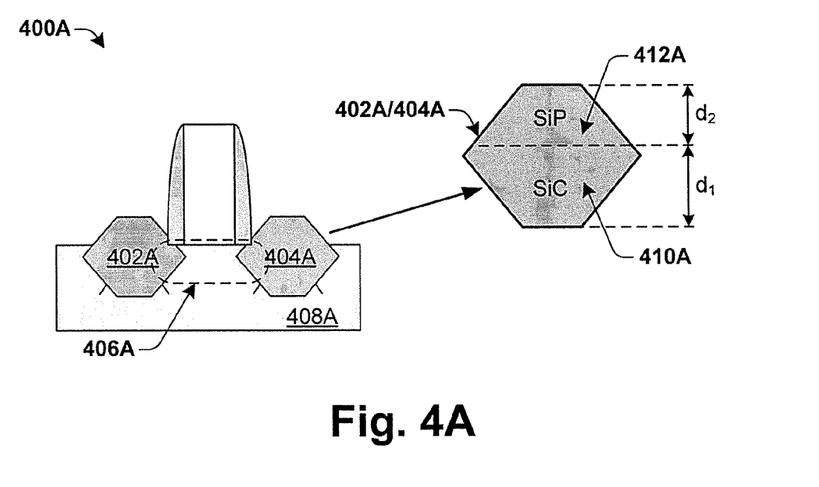
FIGS. 4A-4B illustrate some embodiments of raised source/drain (RSD) epitaxial layer formation and properties in a planar FET.

FIG. 4A illustrates a cross-sectional view of some embodiments of a planar NFET 400A comprising a source region 402A comprising a first epitaxial material further comprising a phosphorous concentration between approximately $2E+21$ atoms/$cm^3$ and approximately $5E+21$ atoms/$cm^3$, and a drain region 404A comprising a second epitaxial material further comprising a phosphorous concentration between approximately $2E+21$ atoms/$cm^3$ and approximately $5E+21$ atoms/$cm^3$. A gate is disposed above a channel region 406A which resides between the source region 402A and the drain region 404A, wherein the first epitaxial material and the second epitaxial material are configured to produce a tensile strain within the channel 406A. For the embodiments of FIG. 4A, the source region 402A and the drain region 404A comprise raised source/drain (RSD) junctions further comprising a faceted profile. In some embodiments, the first epitaxial material and the second epitaxial material comprise silicon carbon phosphorous (SiCP) comprising a carbon concentration between approximately 0.6% and approximately 0.7%. In some embodiments, the first epitaxial material and the second epitaxial material comprise a layer of silicon carbide (SiC) 410A disposed on a surface of the recess, comprising a substitutional carbon concentration between approximately 0.5% and approximately 1%, and a first thickness $d_1$ between approximately 10 nm and approximately 20 nm, and configured to act as a phosphorous diffusion barrier. The first epitaxial material and the second epitaxial material further comprise a layer of silicon phosphate (SiP) 412A disposed on the layer of SiC, comprising a second thickness $d_2$ between approximately 10 nm and approximately 30 nm.

Figure 4B:
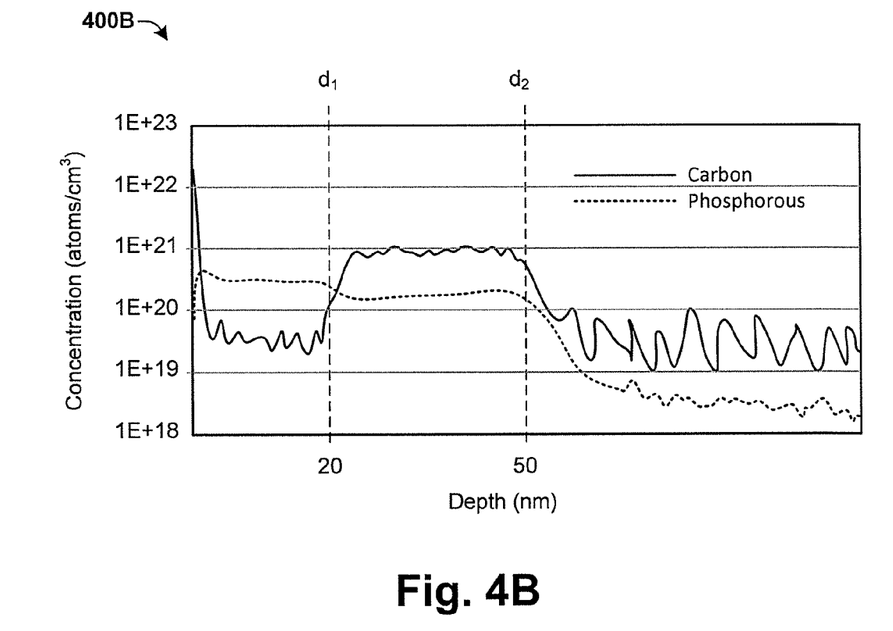

FIG. 4B illustrates some embodiments of a SIMS profile 400B of the RSD junctions of the embodiments of planar NFET 400A, wherein an ionized sputtering source (e.g., $O_2$, Ar, etc.) is utilized to etch away the RSD junction at a constant rate. The type and concentration (atoms/$cm^3$) of ejected atoms are measured using Mass Spectrometry, thus proving a measure of the RSD junction composition as a function of depth. In some embodiments, the second thickness $d_2$ of the layer of SiP 412A comprising a strain and low resistivity layer is measured to be approximately 20 nm with a total phosphorous concentration of approximately 1%, whereas the first thickness $d_1$ of the layer of SiC 410A comprising a diffusion barrier is measured to be approximately 30 nm with a total phosphorous concentration of approximately 0.8%.

Figure 5:
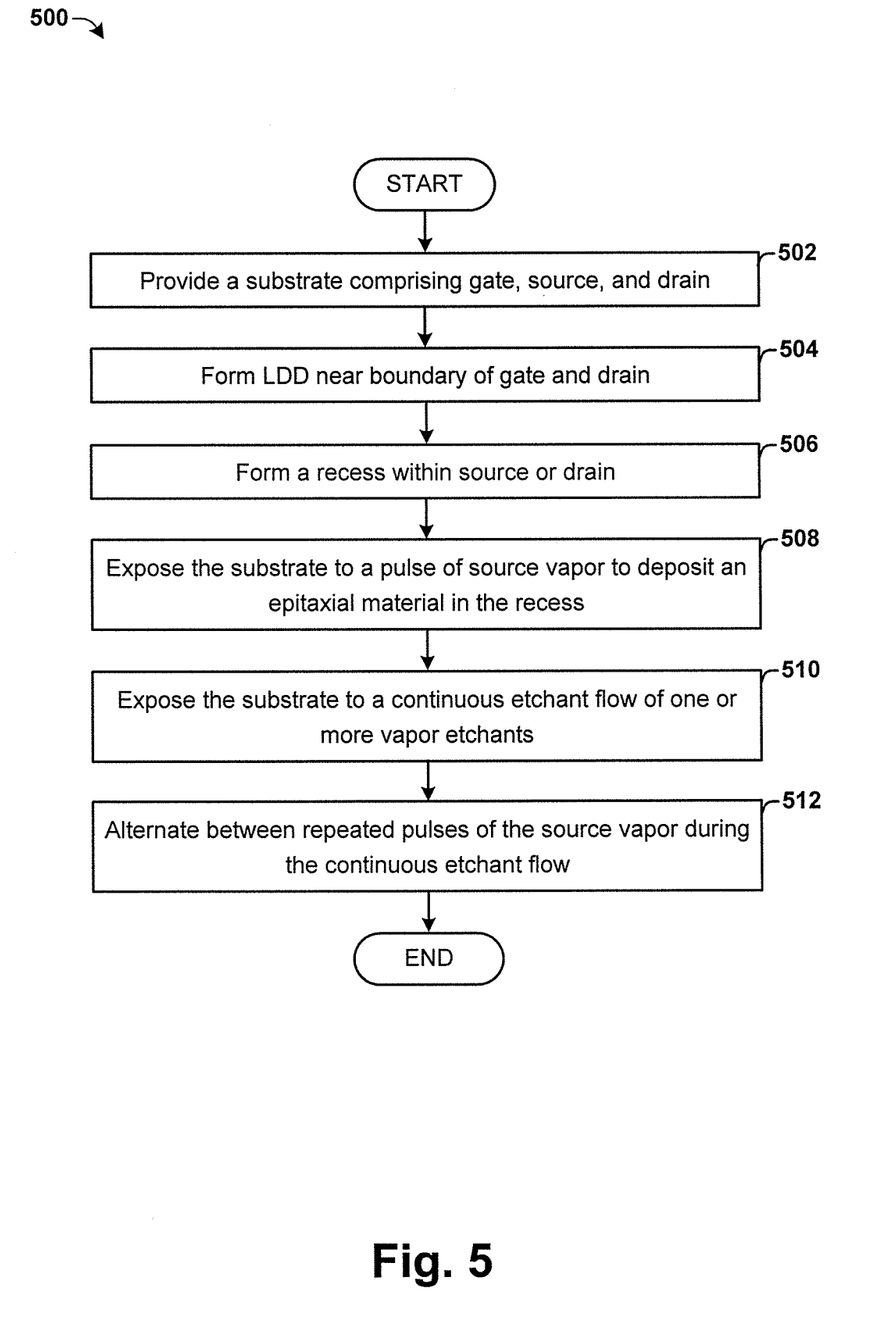
FIG. 5 illustrates some embodiments of a method to form a strained channel in a FET.
Figure 6:
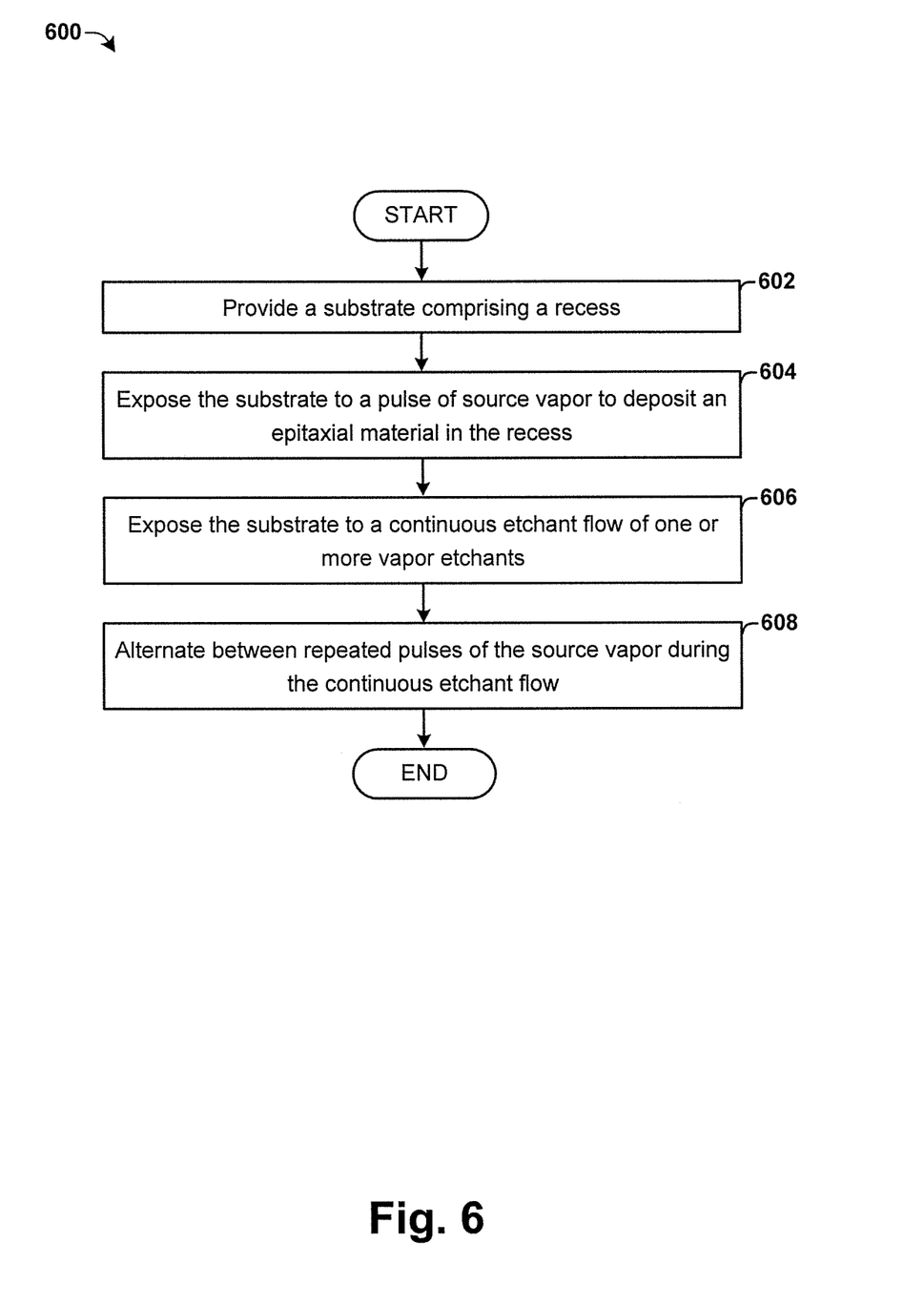
FIG. 6 illustrates some embodiments of a method to selectively form an epitaxial material within a recess.

FIG. 5 illustrates some embodiments of a method 500 to form a strained channel in an NFET. FIG. 6 illustrates some embodiments of a method 600 to selectively form an epitaxial material within a recess. While methods 500 and 600 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 5 illustrates some embodiments of a method 500 to form a strained channel in an NFET. In some embodiments, the NFET comprises a planar NFET wherein the strained channel is subject to tensile strain resulting from phosphorous-doped RSD junctions. In some embodiments, the NFET comprises a FINFET wherein a channel formed within a respective fin is subject to tensile strain resulting from phosphorous-doped epitaxial layers disposed over the respective fin.

At 502 a substrate is provided, the substrate comprising an NFET further comprising a source region, a drain region, and a gate.

At 504 a lightly-doped drain (LDD) region is formed in a vicinity of a boundary between the gate and the drain region or source region. In some embodiments, formation of the LDD comprises an ion implantation followed by a post-implantation anneal. In some embodiments, the ion implantation comprises an ionized phosphorous-containing material or an arsenic containing material with an implant energy between approximately 1 keV to approximately 3 keV, and a dose of between approximately 1E+15 atoms/$cm^3$ and approximately 5E+15 atoms/$cm^3$. In some embodiments, the post-implantation anneal comprises a millisecond anneal further comprising a temperature between approximately 1100° C. and 1200° C. for a duration between approximately 0.9 ms and approximately 3 ms. In some embodiments, the post-implantation anneal comprises a laser anneal comprising a temperature between approximately 1100° C. and 1250° C.

At 506 a recess is formed within the source region or the drain region by an etch process.

At 508 the substrate is exposed to a pulse of a phosphorous-containing source vapor to deposit an epitaxial material in the recess. In some embodiments, the pulse further comprises a carbon-containing source vapor and a silicon-containing source vapor. In some embodiments, the phosphorous-containing source vapor comprises $PH_3$ further comprising a flow rate of between approximately 260 sccm and approximately 310 sccm. In some embodiments, the carbon-containing source vapor comprises monomethyl silane (MMS) further comprising a flow rate of between approximately 132 sccm and approximately 120 sccm. In some embodiments, the silicon-containing source vapor comprises $SiH_4$ or $Si_3H_8$ comprising a flow rate of approximately 190 sccm. In some embodiments, the epitaxial material comprises a phosphorous concentration between approximately 2E+21 atoms/$cm^3$ and approximately 5E+21 atoms/$cm^3$ configured to produce a tensile strain within the channel. The phosphorous concentration also benefits Ni silicidation formation which consumes some of the phosphorous and decreases contact resistance of the source region or the drain region and enhances Shottky barrier height in both planar FETs and FINFETs.

At 510 the substrate is exposed to a continuous etchant flow of one or more vapor etchants configured to selectively remove amorphous portions of the epitaxial material from the recess. In some embodiments, the one or more vapor etchants comprise $Cl_2$ or HCl, $GeH_4$, and a pressure between approximately 10 Torr and approximately 90 Torr.

At 512 the method 500 continues alternating between repeated pulses of the phosphorous-containing source vapor during and the continuous etchant flow for selective removal of the amorphous epitaxial material in the recess. As a result, amorphous epitaxial material is iteratively and selectively removed, while crystalline epitaxial material is iteratively and selectively deposited.

FIG. 6 illustrates some embodiments of a method 600 to selectively form an epitaxial material within a recess. In some embodiments, the recess comprises a source region or drain region of an NFET.

At 602 a substrate is provided, the substrate comprising a recess.

At 604 the substrate is exposed to a pulse of a source vapor to deposit the epitaxial material in the recess, wherein the source vapor comprises carbon, phosphorous, and silicon. In some embodiments, the source vapor comprises $PH_3$ exposed with a flow rate of between approximately 260 standard cubic centimeters per minute (sccm) and approximately 310 sccm, monomethyl silane (MMS) exposed with a flow rate of between approximately 132 sccm and approximately 120 sccm, and $SiH_4$ or $Si_3H_8$ exposed with a flow rate of approximately 190 sccm. In some embodiments, the epitaxial material comprises silicon carbon phosphorous (SiCP) and is deposited with a phosphorous concentration between approximately 2E+21 atoms/$cm^3$ and approximately 5E+21 atoms/$cm^3$ configured to produce a tensile strain within the recess. In some embodiments, SiCP is deposited with a carbon concentration between approximately 0.6% and approximately 0.7% configured to mitigate phosphorous diffusion from the recess. In some embodiments, the epitaxial material comprises a layer of SiC disposed on a surface of the recess and configured to mitigate phosphorous diffusion from the recess, and a layer of SiP disposed on the layer of SiC and configured to produce a tensile strain within the recess.

At 606 the substrate is exposed to a continuous etchant flow of one or more vapor etchants configured to selectively remove amorphous portions of the epitaxial material from the recess.

At 608 the method 600 alternates between repeated pulses of the source vapor during and the continuous etchant flows for selective removal of the amorphous portions of the epitaxial material from the recess.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method of forming enhanced channel carrier mobility within a transistor. Silicon carbon phosphorus (SiCP) source and drain regions are formed within the transistor with cyclic deposition etch (CDE) epitaxy, wherein both resistivity and strain are controlled by substitutional phosphorus. A carbon concentration of less than approximately 1% aids in control of the phosphorus dopant diffusion. Phosphorus dopant diffusion is also controlled by an anneal step which promotes uniform doping through both source and drain, as well as lightly-doped drain regions.

In some embodiments, the present disclosure relates to a method to form a strained channel within a FET, comprising providing a substrate, the substrate comprising a source region, a drain region, and a gate. A lightly-doped drain region is formed in a vicinity of a boundary between the gate and the drain region or the source region. A recess is formed within the source region or the drain region. The substrate is exposed to a pulse of a phosphorous-containing source vapor to deposit an epitaxial material in the recess. The substrate is also exposed to a continuous etchant flow of one or more vapor etchants configured to selectively remove amorphous portions of the epitaxial material from the recess. Alternating between repeated pulses of the phosphorous-containing source vapor and the continuous etchant flow for selective removal of the amorphous epitaxial material in the recess continues until a crystalline layer of phosphorous-containing material is disposed within the recess.

In some embodiments, the present disclosure relates to a method for selectively forming an epitaxial material within a recess, comprising providing a substrate comprising the recess, and exposing the substrate to a pulse of a source vapor to deposit the epitaxial material in the recess, the source vapor comprising carbon, phosphorous, and silicon. The method further comprises exposing the substrate to a continuous etchant flow of one or more vapor etchants configured to selectively remove amorphous portions of the epitaxial material from the recess, and alternating between repeated pulses of the source vapor during and the continuous etchant flows for selective removal of the amorphous portions of the epitaxial material from the recess.

In some embodiments, the present disclosure relates to an n-type field-effect transistor (NFET), comprising a source region comprising a first epitaxial material further comprising a phosphorous concentration between approximately $2E+21$ atoms/cm$^3$ and approximately $5E+21$ atoms/cm$^3$, and a drain region comprising a second epitaxial material further comprising a phosphorous concentration between approximately $2E+21$ atoms/cm$^3$ and approximately $5E+21$ atoms/cm$^3$. A gate is disposed above a channel region which resides between the source region and the drain region, and a lightly-doped drain region in a vicinity of a boundary between the gate and the drain region or the source region, wherein the first epitaxial material and the second epitaxial material are configured to produce a tensile strain within the channel.

What is claimed is:

1. A method to form a strained channel within a field-effect transistor, comprising:
    providing a substrate comprising a source region, a drain region, and a gate;
    forming a lightly-doped drain region in a vicinity of a boundary between the gate and the drain region or the source region;
    forming a recess within the source region or the drain region;
    exposing the substrate to a pulse of a phosphorous-containing source vapor to deposit an epitaxial material in the recess;
    exposing the substrate to a continuous etchant flow of one or more vapor etchants configured to selectively remove amorphous portions of the epitaxial material from the recess; and
    alternating between repeated pulses of the phosphorous-containing source vapor and the continuous etchant flow for selective removal of the amorphous portions of the epitaxial material in the recess.

2. The method of claim 1, wherein the pulse further comprises a carbon-containing source vapor and a silicon-containing source vapor.

3. The method of claim 2, wherein the phosphorous-containing source vapor comprises $PH_3$ provided at a first flow rate of between approximately 260 standard cubic centimeters per minute (sccm) and approximately 310 sccm.

4. The method of claim 3, wherein the carbon-containing source vapor comprises monomethyl silane (MMS) provided at a second flow rate of between approximately 132 sccm and approximately 120 sccm.

5. The method of claim 4, wherein the silicon-containing source vapor comprises $SiH_4$ or $Si_3H_8$ provided at a third flow rate of approximately 190 sccm.

6. The method of claim 5, wherein the epitaxial material comprises silicon carbon phosphorous (SiCP) and is deposited with a phosphorous concentration between approximately $2E+21$ atoms/cm$^3$ and approximately $5E+21$ atoms/cm$^3$ configured to produce a tensile strain within a channel region under the gate.

7. The method of claim 6, wherein the SiCP is deposited with a carbon concentration between approximately 0.6% and approximately 0.7%, and wherein the carbon is configured to mitigate phosphorous diffusion from the recess.

8. The method of claim 6, wherein the epitaxial material comprises:
    a layer of silicon carbide (SiC) disposed on a surface of the recess and configured to mitigate phosphorous diffusion from the recess, wherein the layer of SiC has a substitutional carbon concentration between approximately 0.5% and approximately 1% and has a first thickness between approximately 1 nm and approximately 20 nm; and
    a layer of silicon phosphate (SiP) disposed on the layer of SiC and configured to produce the tensile strain within the channel region, wherein the layer of SiP has a second thickness between approximately 10 nm and approximately 30 nm.

9. The method of claim 1, wherein formation of the lightly-doped drain comprises:
    an ion implantation of a phosphorous-containing material or an arsenic-containing material at an energy between approximately 1 keV to approximately 3 keV and a dose of between approximately 1E+15 atoms/cm$^3$ and approximately 5E+15 atoms/cm$^3$; and a post-implantation anneal comprising a millisecond anneal carried out at a first temperature between approximately 1100° C. and 1200° C. for a duration between approximately 0.9 ms and approximately 3 ms, or a laser anneal comprising a second temperature between approximately 1100° C. and 1250° C.

10. The method of claim 1, the one or more vapor etchants comprising:

Cl$_2$ or HCl;

GeH$_4$; and a pressure between approximately 10 Torr and approximately 90 Torr.

11. A method for selectively forming an epitaxial material within a recess, comprising:

providing a substrate comprising the recess;

exposing the substrate to a pulse of a source vapor to deposit the epitaxial material in the recess, the source vapor comprising carbon, phosphorous, and silicon;

exposing the substrate to a continuous etchant flow of one or more vapor etchants configured to selectively remove amorphous portions of the epitaxial material from the recess; and alternating between repeated pulses of the source vapor during the continuous etchant flow for selective removal of the amorphous portions of the epitaxial material from the recess.

12. The method of claim 11, wherein exposing the substrate to the pulse of the source vapor comprises:

providing PH$_3$ at a first flow rate of between approximately 260 standard cubic centimeters per minute (sccm) and approximately 310 sccm;

providing monomethyl silane (MMS) at a second flow rate of between approximately 132 sccm and approximately 120 sccm; and providing SiH$_4$ or Si3H$_8$ at a third flow rate of approximately 190 sccm.

13. The method of claim 11, wherein the epitaxial material comprises silicon carbon phosphorous (SiCP) and is deposited with a phosphorous concentration between approximately 2E+21 atoms/cm$^3$ and approximately 5E+21 atoms/cm$^3$.

14. The method of claim 13, wherein the SiCP is deposited with a carbon concentration between approximately 0.6% and approximately 0.7% configured to mitigate phosphorous diffusion from the recess.

15. The method of claim 11, wherein the epitaxial material comprises:

a layer of silicon carbide (SiC) disposed on a surface of the recess and configured to mitigate phosphorous diffusion from the recess, wherein the layer of SiC has a substitutional carbon concentration between approximately 0.5% and approximately 1% and has a first thickness between approximately 1 nm and approximately 20 nm; and a layer of silicon phosphate (SiP) disposed on the layer of SiC configured to produce a tensile strain wherein the layer of SiP has a phosphorous concentration between approximately 2E+21 atoms/cm$^3$ and approximately 5E+21 atoms/cm$^3$ and has a second thickness between approximately 10 nm and approximately 30 nm.

16. The method of claim 11, the one or more vapor etchants comprising:

Cl$_2$ or HCl;

GeH$_4$; and a pressure between approximately 10 Torr and approximately 90 Torr.

17. A method, comprising:

forming recesses within a substrate on opposite sides of a gate; and exposing the substrate to a continuous etchant flow of one or more vapor etchants while providing intermittent pulses of a source vapor to the substrate, wherein the intermittent pulses of the source vapor deposit an epitaxial material in the recesses, and wherein the continuous etchant flow selectively removes amorphous portions of the deposited epitaxial material from the recesses while leaving crystalline portions of the deposited epitaxial material intact within the recess.

18. The method of claim 17, wherein the source vapor comprises a carbon-containing material.

19. The method of claim 18, wherein the carbon-containing material comprises monomethyl silane (MMS).

20. The method of claim 17, wherein the source vapor comprises a phosphorous-containing material.

21. The method of claim 20, wherein the phosphorous-containing material comprises phosphine (PH$_3$).

22. The method of claim 17, wherein the one or more vapor etchants comprises a mixture of GeH$_4$ and Cl$_2$ or a mixture of GeH$_4$ and HCl.

* * * * *